United States Patent [19]

Laws et al.

[11] Patent Number: 4,633,466
[45] Date of Patent: Dec. 30, 1986

[54] SELF TESTING DATA PROCESSING SYSTEM WITH PROCESSOR INDEPENDENT TEST PROGRAM

[75] Inventors: Gerald E. Laws; Keith E. Diefendorff, both of Austin, Tex.

[73] Assignee: Texas Instruments Incorporated, Dallas, Tex.

[21] Appl. No.: 605,752

[22] Filed: May 1, 1984

[51] Int. Cl.$^4$ .............................................. G06F 11/00
[52] U.S. Cl. ..................................... 371/16; 364/200; 371/20
[58] Field of Search .................... 371/16, 20; 364/200, 364/900

[56] References Cited

U.S. PATENT DOCUMENTS

| | | | |
|---|---|---|---|
| 3,623,011 | 11/1971 | Baynard, Jr. et al. | 364/200 |
| 4,014,005 | 3/1977 | Fox et al. | 364/200 |
| 4,108,358 | 8/1978 | Niemaszyk et al. | 371/20 |
| 4,251,861 | 2/1981 | Mago | 364/200 |
| 4,312,066 | 1/1982 | Bantz et al. | 371/16 |
| 4,354,225 | 10/1982 | Frieder et al. | 364/200 |
| 4,371,952 | 2/1983 | Schuck | 364/900 |

*Primary Examiner*—Charles E. Atkinson
*Attorney, Agent, or Firm*—Kenneth C. Hill; James T. Comfort; Melvin Sharp

[57] ABSTRACT

The present invention relates to a self testing data processing system which includes a communications bus for communication between a number of slots, at least one nonintelligent data processing circuit connected to one of those slots and at least one intelligent data processing circuit connected to another of those slots. Each nonintelligent data processing circuit includes a test memory which is readable from the communication bus. The test memory has a diagnostic program stored therein for testing that nonintelligent data processing circuit. This diagnostic program is written in an intermediate level interpretable test language. Each of the intelligent data processing circuits includes an interpreter program for interpreting the intermediate level interpretable test language into the native code of the intelligent data processing circuit. Testing of the data processing system takes place by the intelligent data processing circuit recalling, interpreting and executing the diagnostic program stored in the test memory of each nonintelligent data processing circuit. In a further embodiment, the data processing system includes a mass memory means, such as a disk system, which includes additional system diagnostic programs written in the intermediate level interpretable test language. Additional system diagnostics can be performed by the intelligent data processing circuit by recall, interpretation and execution of this additional diagnostic program stored in the mass memory.

12 Claims, 6 Drawing Figures

SELF TESTING DATA PROCESSING SYSTEM WITH PROCESSOR INDEPENDENT TEST PROGRAM

BACKGROUND OF THE INVENTION

The present invention relates to self testing in a complex data processing system such as a multiprocessor computer system. It is typical within such complex data processing systems to provide a measure of self testing in order to enable quick detection and location of any faults within the data processing system. It is typical within such self testing systems to provide a self test program written in the native language of the central processing unit of the computer. This central processing unit then recalls and executes this program in order to provide the test functions.

There are several design trends which make continued reliance upon this single test program written in the native code of the single processing unit disadvantageous. Firstly, the construction of such computer systems is becoming increasingly modular. That is, a base system is provided having a number of slots for receiving plug-in circuit boards. Then the user assembles a system by selecting a desired set of plug-in circuit boards from among a selection of differing types of circuit boards. This type of construction puts a design constraint on the individual circuit boards that they may operate in a variety of differing configurations with differing additional circuit boards. In addition, it is considered convenient for the user to be able to insert any board within any one of the plug-in slots. Secondly, a further design trend is toward the use of more than one processor unit. Multiprocessor systems are employed to provide greater computing power through concurrent processing or through special purpose processing. Although microprocessor units do come in "families" which share the same native language, it is often desirable to include microprocessors in a single system from differing "families". In such a case, in accordance with the prior art, it is necessary to choose a single microprocessor native language and write the data processing test program in that language. This situation is considered less than ideal because, although an additional microprocessor may be available even when the primary microprocessor fails, it is not possible for the secondary microprocessors which do not execute the native code in which the test program is written to perform these system tests. Thus, while processing capability is available to both perform these tests and perhaps to perform some normal operating functions, the system is inoperable due to the incompatibility of the native languages of the microprocessors.

In many such complex data processing systems, there will be at least some circuit boards which cannot perform their own self test. Such things as random access memory boards are not normally provided with self test capability. It would be advantageous to provide on such nonintelligent data processing circuits a program for testing this circuit board which can be executed by an intelligent data processing circuit elsewhere in the system. In a computer system which is modular and permits microprocessors with differing native languages, in accordance with the prior art, a design choice must be made as to which native language to employ in the test program for this nonintelligent data processing circuit. Alternately, the test program may be provided in each of the native languages of the permitted microprocessors of the system. Either of these choices excludes the possibility of enabling a new microprocessor having a differing native language to run the tests of prior nonintelligent circuits.

SUMMARY OF THE INVENTION

The present invention is a self testing data processing system having a communication bus connecting a plurality of slots, at least one nonintelligent data processing circuit and at least one intelligent data processing circuit. The data processing system is tested by having an intelligent data processing circuit execute a test program located on the nonintelligent data processing circuit.

Each nonintelligent data processing circuit in the system includes a test memory. The test memory contains a diagnostic program which has been written to test that particular nonintelligent data processing circuit. This test program is written in an intermediate level interpretable test language. This test language is not tied to any particular processor native language, but rather is independent of such native languages.

The intelligent data processing circuits within this system all include an interpreter program. This interpreter program enables the intelligent data processing system to interpret and execute any test program written in the intermediate level interpretable test language. By adopting a single test language as a standard, any nonintelligent data processing circuit can contain a single test program which may be interpreted and executed by any intelligent data processing circuit, including intelligent data procesing circuits having differing processors with differing native languages. This adoption of a test language enables any future nonintelligent data processing circuits to be tested by provision of an appropriate test program. In addition, any future intelligent data processing circuit which has a differing native language from the prior intelligent data processing circuits can also interpret and execute the test program for any nonintelligent data processing circuit by interpretation of the diagnostic program in the intermediate level interpretable test language. This is because it will almost certainly be possible to write an interpreter program in order to interpret the diagnostic program in the test language into the native code of the new intelligent data processing circuit.

In a further embodiment of the present invention, the data processing system includes a mass memory, such as a disk drive, which includes additional system test programs written in the intermediate level interpretable test language. Thus, any operating intelligent data processing circuit can call up this system test program from the mass memory and execute a system test by interpretation and execution of this system test program. In addition, the mass memory may include a plurality of such system test programs, each geared to a particular set of previously discovered faults in the data processing system.

BRIEF DESCRIPTION OF THE DRAWINGS

These and other objects of the present invention will become apparent from the following detailed description of the invention taken in conjunction with the drawings in which.

DETAILED DESCRIPTION OF THE PREFERRED EMBODIMENT

The invention will now be described in detail in association with the drawings of FIGS. 1 to 5A/5B. It should be understood that the particular structures illustrated and described are intended merely to be illustrative of the invention and are not to be construed to limit the invention. The limitations on the invention are detailed in the attached claims.

Figure 1:
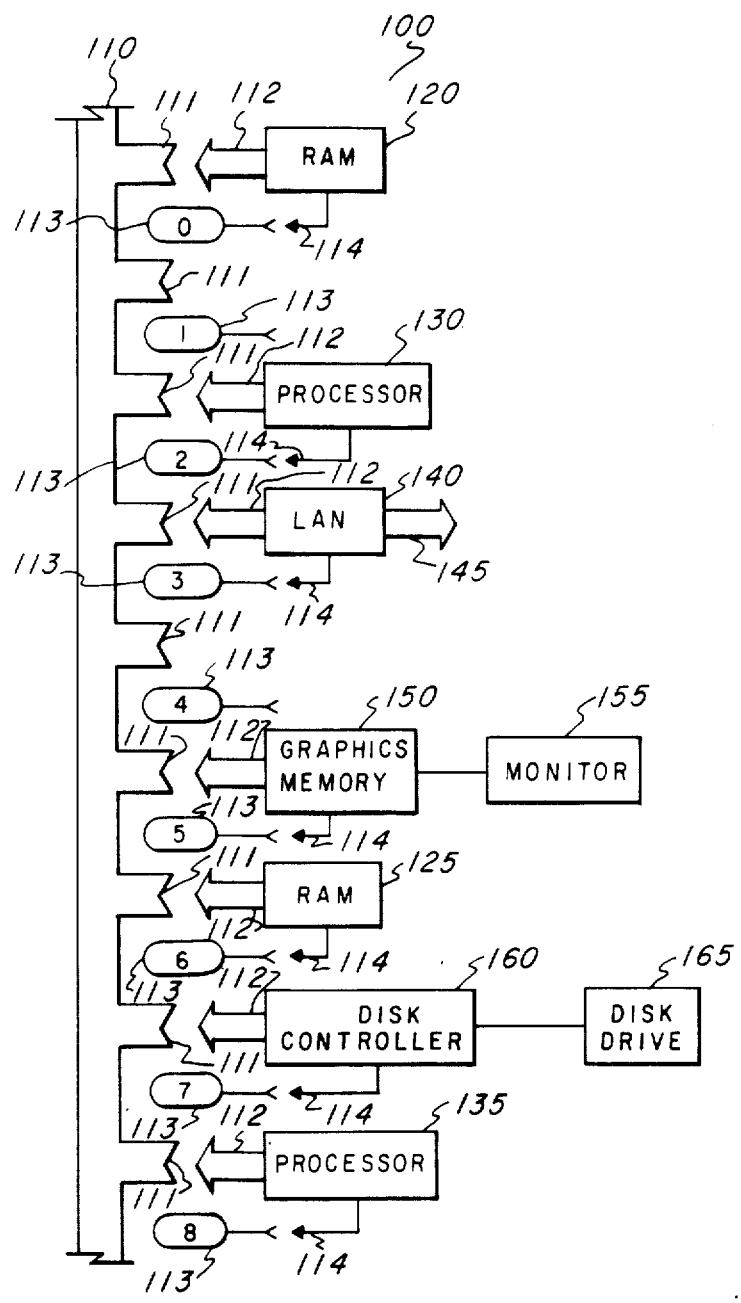
FIG. 1 illustrates a computer system to which the present invention is applicable.

FIG. 1 illustrates data processing system 100 to which the present invention is applicable. Data processing system 100 includes communication bus 110 and various plug-in data processing circuit boards which may be inserted into various slots of communication bus 110. Data processing system 100 includes random access memory circuit 120, processor circuit 130, local area network circuit 145, graphics memory 150, random access memory 125, disk controller 160 and processor 135.

Each slot of communications bus 110 includes a bus connector 111 and a slot number 113. Bus connector 111 mates with a similar connector 112 on each of the data processing circuit boards. This connection allows communication of the signals on bus 110 to and from the particular component entered in that slot. Communications bus 110 further includes slot number connectors 113 which mate with a slot number connector 114 on the circuit board connected to that slot. Note that each slot number connector 113 includes a unique slot number, slot numbers 0 to 8 in the example illustrated in FIG. 1. This permits identification of the particular slot to the circuit board inserted into that slot. Thus, for example, random access memory circuit board 120 may be inserted into any of the nine slots illustrated and the particular slot number connector 111 of that slot will identify to the circuit board the physical location within the set of slots. This unique slot number may be achieved by having a multipin connector from the slot connector 113 to the circuit board via the slot number connector 114. This multibit connector may be tied at the slot connector 113 to either of two logical levels forming a digital number on these lines. Each slot could then be given a different digital number thereby uniquely specifying the particular slot. In the preferred embodiment, a total of four lines are used, allowing a total of 16 different unique slot numbers.

The desired data processing system 100 is assembled by inserting into the slots provided in communications bus 110 the appropriate circuit boards. The data processing system 100 illustrated in FIG. 1 includes random access memory circuit board 120 inserted into slot 0, processor circuit board 130 inserted into slot 2, local area network controller 140 inserted into slot 3, graphics memory 150 inserted into slot 5, random access memory 125 inserted into slot 6, disk controller 160 inserted into slot 7 and processor 135 inserted into slot 8. It should be noted that local area network controller 140 includes a connection 145 to the local area network. Graphics memory 115 is also further connected to a monitor 155 which it controls. Lastly, disk controller 160 is coupled to disk drive 165 which it controls.

In the self test design of data processing system 100, the circuit boards are divided into two categories, intelligent circuit boards, and nonintelligent circuit boards. Each intelligent circuit board must be capable of being the system test master. In order to be a system test master, a circuit board must include a general purpose data processor capable of executing programs communicated to it via the communications bus 110. Each nonintelligent board includes less than this capacity. Processors 130 and 135 each have the capacity to perform their own self tests and to be system test master and are intelligent circuit boards.

All other circuit boards in the data processing system 100 are nonintelligent circuit boards. Note that nonintelligent circuit boards may have some but not all of the characteristics of intelligent circuit boards. It is not contemplated that random access memory circuit boards 120 and 125 have self test capability or processing capability. On the other hand, circuits such as local area network controller 140 and disk controller 160 may include a processor and have considerable data processing capability, which may include self test capabilities, but would still be nonintelligent boards. This is because neither of these circuit boards would ordinarily be enabled to perform general purpose data processing based on programs communicated via communications bus 110 and thus could not be a system test master.

Figure 2:
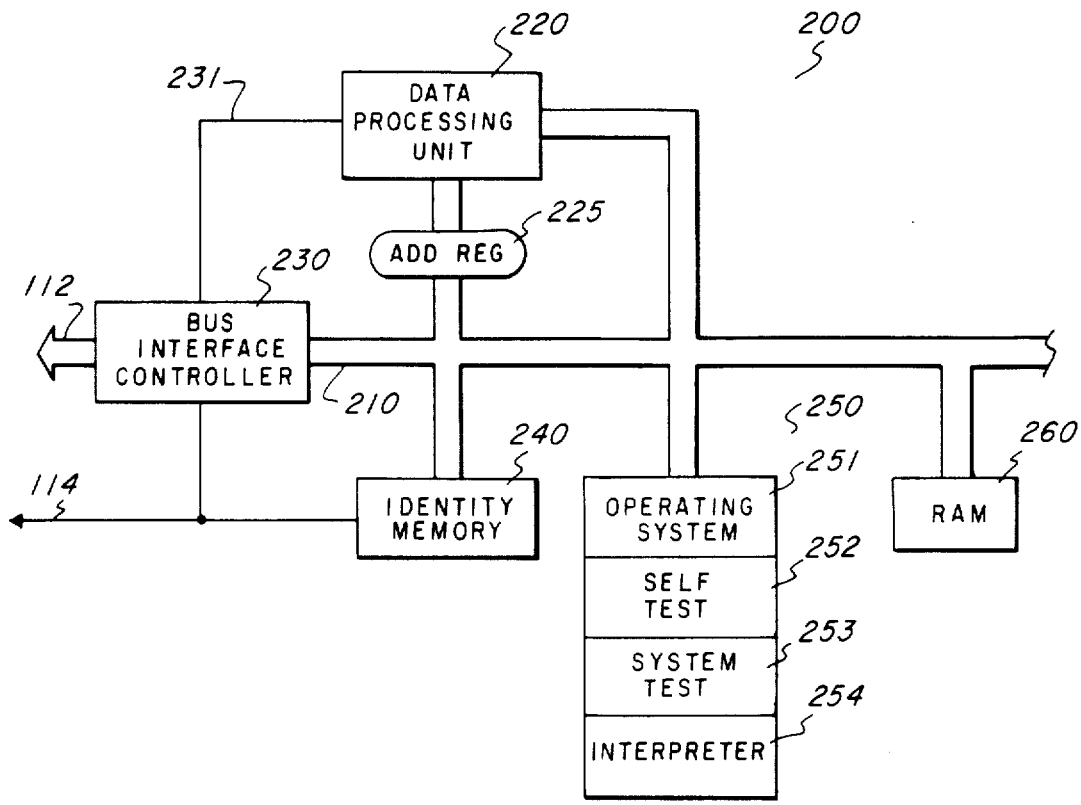
FIG. 2 illustrates the parts of a typical intelligent data processing circuit.

FIG. 2 illustrates processor circuit 200 which is a typical example of an intelligent board used in data processing system 100 illustrated in FIG. 1. Each of processors 130 and 135 would include the general structure illustrated in FIG. 2. Processor circuit 200 includes bus 210, data processing unit 220 with address register 225, bus interface controller 230, identity memory 240, read only memory 250 and random access memory 260. The heart of processor circuit 200 is data processing unit 220, which may be a single chip microprocessor. Data processing unit 220 in conjunction with address register 225 receives data and programs from communications bus 110 via bus conroller 230 and manipulates data in conjunction with identity memory 240, read only memory 250 and random access memory 260. The major communication within processor 200 occurs via bus 210. Bus 210 is coupled to address register 225 and to the data input and output portion of data processing unit 220. Data exchange among the various circuits in processor 200 occurs for the most part via bus 210. In general, a program step is entered into data processing unit 220, generally in conjunction with a read memory operation from an address specified by address 225. This instruction causes a data processing operation within data processing unit 220 which then generates results also on bus 210, for storage within random access memory 260 or identity memory 240 or for transmission to communications bus 110 via bus interface controller 230.

Data processing unit 220 is coupled to communications bus 110 via bus connector 112 and slot number connector 114. Bus interface controller 220 operates under the control of data processing unit 220 via control lines 231. Bus interface controller 230 controls the exchange of data between communications bus 110 and the internal bus 210 within processor 200. On some occasions, bus interface controller 230 is controlled viadata processing unit 220 to receive data from communications bus 110. On other occasions data processing unit 220 controls bus interface controller 230 to enable data generated within processor circuit 200 to be transmitted to bus 110. Finally, in other cases, bus interface controller 230 decouples communications bus 110 from bus 210 and processor 200 operates internally only.

Figure 3:
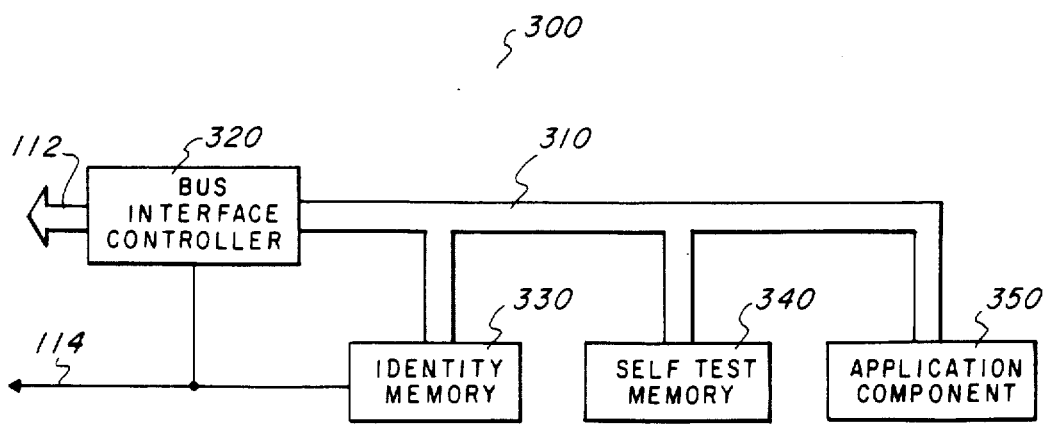
FIG. 3 illustrates the parts of a typical nonintelligent data processing circuit.

An important component of processor 200 is identity memory 240. Identity memory 240 is coupled to the slot connector 113. In accordance with the preferred embodiment, slot connector 113 specifies the most significant bits of the address of identity memory 240. Each identity memory on every circuit board, including both intelligent circuit boards such as illustrated in FIG. 2 and nonintelligent circuit boards such as illustrated in FIG. 3, have the identical least significant bits of their address. Therefore, knowing the slot number of any particular circuit board, it is possible to calculate the starting address of its identity memory. Identity memory 240 is also connected to bus 210 and thereby connected to bus controller 230 and hence to communications bus 110. It is necessary for identity memory 240 to be readable via communications bus 110. The path from communications bus 110 through bus interface controller 220 and bus 210 serves as this link. Any other circuit board in any other slot may read from identity memory 240 by sending a read signal specifying the address having the most significant bits corresponding to the slot and the least significant bits corresponding to the identical start address for each identity memory. The contents of the identity memory are employed in identification of a particular circuit board to other circuit boards via bus 110. The contents of identity memory 240 are further described below in conjunction with FIG. 4.

Read only memory 250 includes several parts which are employed in the self testing data processing system of the present invention. Read only memory 250 includes operating system 251, self test program 252, system test program 253 and interpreter program 254. Operating system 251 includes at least some basic instructions enabling data processing unit 220 to start upon system power up or system reset. These things may include the instructions for controlling bus interface controller 230, the memory locations for identity memory 240 and random access memory 260 and other fundamental features. In addition, operating system 251 may include further sets of instructions for the basic operation of data processing unit 220. Alternately, such other basic instructions may be loaded into random access memory 260 from another circuit board via communication bus 110, bus interface controller 230 and bus 210.

Read only memory 250 further includes self test program 252. Self test program 252 is written to cause data processing unit 220 to exercise all major facilities of processor circuit 200. This may include such things as performing a cyclic redundancy check on a portion or all of read only memory 250 and comparing this with a previously calculated result stored during manufacture within read only memory 250, reading and writing to various memory locations within random access memory 260 and other tasks which exercise the data processing capabilities of circuit 200. Self test program 252 is preferably written in order to exercise the capability of circuit 200 without communication to bus 110 via bus interface controller 230. That is, these tests are preferably strictly local in nature in order to isolate faults within circuit 200. Self test program 252 may be written in the native language of processor 220 for direct execution or may be written in the processor independent test language for execution in conjunction with interpreter program 254 in the manner expained below.

Read only memory further includes system test program 253. System test program 253 includes a program for execution by data processing unit 220 in order to determine which available processor circuit board is to be system test master and then to execute system tests if this board is determined to be the system test master. The operation of system test program 253 is more fully described below in conjunction with program 500 illustrated in FIGS. 5A and 5B. In general, this system test is designed to exercise the major facilities of the entire data processing system 100 in order to isolate and identify any failures within the major systems of data processing system 100.

Read only memory 250 further includes interpreter program 254. Interpreter program 254 is an interpreter for an intermediate level interpretable test language. Interpreter program 254 is used in conjunction with a diagnostic program stored on nonself testing, nonintelligent circuit boards. Interpreter program 254 enables data processing unit 220 to execute the diagnostic program stored on any nonintelligent board which is written in the test language. This test language has been selected to be processor independent, that is it does not depend upon the particular type data processing unit 220 which executes this program. An important feature of the self testing data processing system of this invention is the provision of this interpreter program 254. Interpreter program 254 is written in the native language of data processing unit 220 in accordance with well known principles in order to enable interpretation and execution of the test language which has been selected for the diagnostic programs on the nonintelligent circuit.

Processor circuit 200 further includes random access memory 260. Random access memory 260 provides a portion of read/write memory which data processing unit 220 can use during performance of data processing functions. Although processor circuit 200 can communicate with any random access memory circuit within the data processing system 100 via communications bus 110, it is considered desirable to provide at least a small amount of random access memory on each processor circuit. This enables data processing unit 220 to store blocks of program steps or intermediate data which it can manipulate without requiring it to seek access to communications bus 110 and arbitrate with other circuits for the use of the bus. Thus the provision of at least a small amount of read/write memory such as random access memory 260 on processor circuit 200 could greatly enhance the speed of operation of this circuit.

FIG. 3 illustrates the typical structure of a nonintelligent circuit 300. Nonintelligent circuit 300 includes bus 310, bus interface controller 320, identity memory 330, self test memory 340 and application component 350.

Bus interface controller 320 couples to communications bus 110 via connector 112. Bus interface controller 320 controls the communication between communications bus 110 and bus 310 internal to circuit 300.

Identity memory 330 is coupled to bus 310 and to slot number connector 114. In a manner similar to identity memory 240, identity memory 330 responds to read commands on bus 110 specifying an address having the most significant bits corresponding to the slot connector 113 to which circuit 330 is connected and having the identical least significant bits corresponding to each identity memory. Identity memory 330 includes data identifying the particular circuit board and many of its capabilities. The preferred contents of identity memory 330 is illustrated in FIG. 4.

Circuit 300 further includes self test memory 340. Self test memory 340 includes a diagnostic program which is written in order to exercise the major functions of the circuit 300 including the functions of application component 350. In accordance with the self testing data processing system of the present invention, the diagnostic programs stored within self test memory 340 is written in a processor independent test language. This test language is preferably an intermediate level interpretable language such as Forth. As noted in conjunction with FIG. 2, each intelligent data processing circuit 200 includes an interpreter program for interpreting this test language. In the preferred embodiment the interpreter program 254 includes a kernal of primitive functions in this interpretable test language. The diagnostic programs stored within self test memory 340 utilizes this kernal of primitives in order to define additional operations which are ultimately used to test the major functions of the circuit.

Application component 350 is the major useful portion of nonintelligent circuit board 300. It may be any circuit that is useful to data processing system 100. Random access memory circuit boards 120 and 125 include random access memory as their application component. Local area network controller 140 and disk controller 160 have application components which communicate with and control other circuits useful to data processing system 100. Similarly, graphics memory 150 has as its application component memory for storing the contents of a graphics display and control circuits for causing monitor 155 to generate that display.

Figure 4:
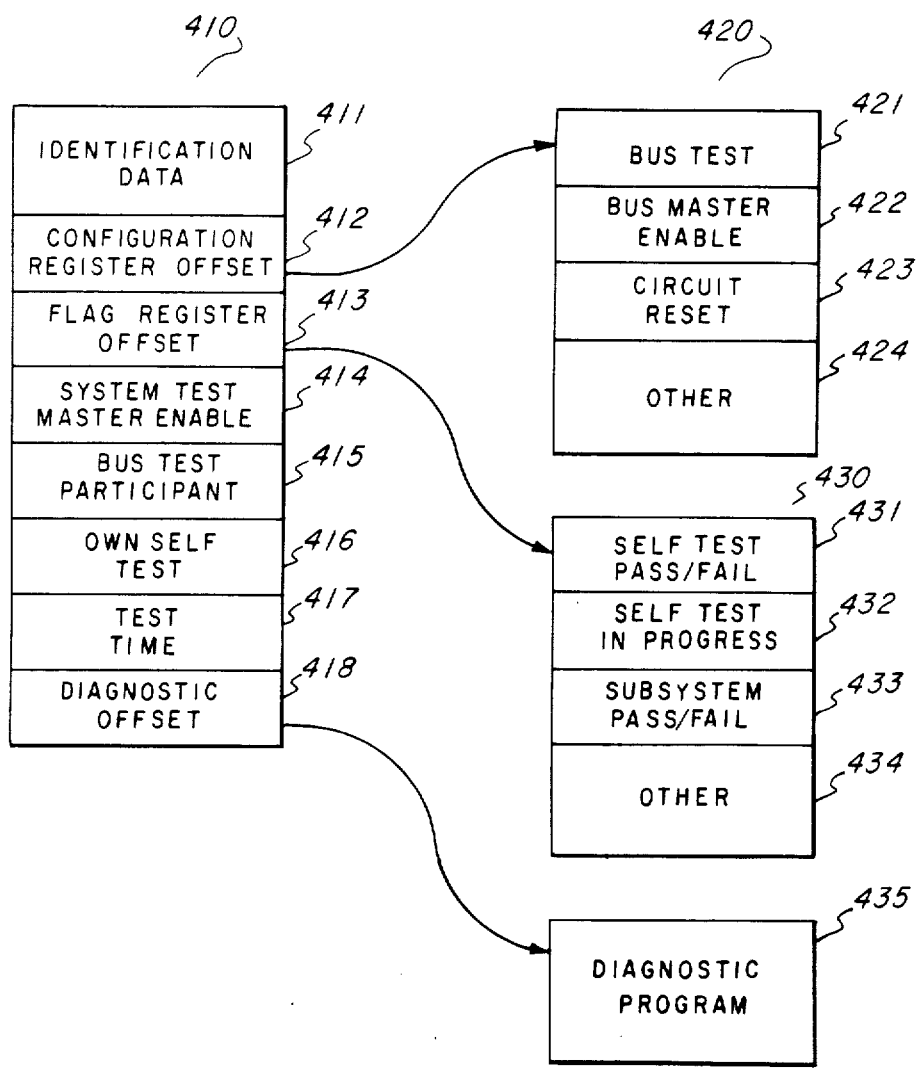
FIG. 4 illustrates the contents of the identity memory in accordance with the present invention.

FIG. 4 illustrates the contents of a typical identity memory such as is included in each circuit within data processing system 100. Each such identity memory is arranged in this fashion. However, each identity memory may not include all of the parts illustrated in FIG. 4.

Identity memory includes a first part 410 which is located at the base address of the identity memory. This base address is calculated from a fixed set of least significant bits which is common to each identity memory and a set of most significant bits which is dependent upon the slot number. Therefore, the beginning of the data within identity memory 410 is at an address which is readily calculatable for each of the slots in communication bus 110. This first part of identity memory 410 includes identification data 411, configuration register offset 412, flag register offset 413, system test master enable flag 414, bus test participant flag 415, own self test flag 416, test time data 417 and diagnostic offset 418.

The identification data 411 for each identity memory includes information which specifically identifies the particular circuit board. This may include the part number and serial number of the circuit, the revision level, the circuit type, the circuit vendor and other such identification data. This data will permit system configuration dynamically upon power up thereby enabling any circuit to be placed in any slot. Identification data 411 may also include some error checking codes which enable a reading device to determine whether or not it has properly read the identification memory by a cyclic redundancy check with this error checking code. This identification data may also include data on the length of the identity memory because differing circuits may have differing identity memory lengths.

The configuration register offset 412 is a pointer to another location within the identification memory called the configuration register. The configuration register offset 412 is preferably the distance from the identity memory base address to the start of the configuration register. The configuration register. The configuration register offset 412 is preferably the distance from the identity memory base address to the start of the configuration register. The configuration register 420 includes bus test flag 421, bus master enable flag 422, circuit reset flag 424 and other data 424. The bus test flag 421 indicates whether or not the circuit board is performing a bus test on communications bus 110. This is preferably a single bit set by the system test master and reset by the circuit board when the bus test is completed. The bus master enable flag 422 indicates whether or not this circuit is permitted to request bus master status. This request must be made in order to participate in the arbitration for control of communications bus 110. This is preferably a single bit which is set if the circuit is enabled by the system to be a bus master and reset if the circuit board is disabled as a master. Circuit reset flag 423 is preferably controlled by the communication bus 110 to control whether the circuit board performs a reset function. This is preferably a single bit which if set causes the circuit board to restart its functions and otherwise permits normal operation. Configuration register 420 also includes other data 424 which includes additional data on the type of circuit board. This may include starting addresses for particular functions and other similar data.

Flag register offset 413 is similar to configuration register offset 412. Flag register offset 413 includes the data for calculating the start address of flag register 430. This calculation is made from the start address of identity memory 410 and the data within flag register offset 413.

Flag register 430 includes self test pass/fail flag 431, self test in progress flag 432, subsystem pass/fail flag 433 and other data 434. Self test pass/fail flag 431 is preferably a single bit which indicates whether the system has passed or failed its own circuit test. This single bit is preferably set if the circuit board has failed its self test and a reset if the circuit board has passed its circuit test. Self test in progress flag 432 is preferably a single bit which indicates whether or not the circuit self test is in progress. This single bit is preferably set if the self test is in progress and reset if the self test is complete. Subsystem pass/fail flag 433 is preferably a single bit which indicates whether a subsystem which is controlled by the circuit board has passed or failed a subsystem test. This data is useful in the case of disk controller 160 and disk drive 165, for example. Disk controller 160 is coupled directly to communications bus 110 and thus may indicate to communications bus 110 whether or not disk drive 165, which is controlled by disk controller 160, has passed or failed a subsystem test. This bit is preferably set if the subsystem has failed and reset if the subsystem has passed. Other data 434 may be employed to communicate other conditions of the circuit.

System test master enable flag 414 is preferably a single bit which indicates whether or not the circuit can become the system test master. This bit is preferably set if the board can become the system test master and reset if it cannot become system test master.

Own self test flag 416 indicates whether or not this particular circuit can perform its own circuit test. This is preferably a single bit which is set if the circuit can perform its own circuit test and reset if the circuit board cannot perform its own self test.

Test time data 417 indicates the length of time required for the circuit to perform its own circuit test. In the event that the circuit can perform its own self test, then test time data 417 indicates the length of time the present circuit requires to perform its own circuit self test. This data is employed by other intelligent data processing circuits in order to determine whether or not the present circuit has taken too great a time to complete its circuit self test. This test time data 417 is preferably one byte of memory which indicates the base two logarithm of the test duration in seconds. The test duration indicated by test time data 417 is preferably the upper bound of test time required for the particular circuit to perform its own self test.

Diagnostic offset 418 is a memory pointer which indicates the beginning of diagnostic program 440. This is preferably data which indicates the distance in address from the base address of identity memory 410 to the beginning of the diagnostic program 440. This address is most important in the case of a nonintelligent data processing circuit which cannot perform its own circuit self test. This offset enables another data processing circuit to determine the beginning of the diagnostic program from communications bus 110. This determination of the beginning of diagnostic program 440 then permits an intelligent data processing circuit to recall, interpret and execute the diagnostic program thereby testing the circuit in question. In the case of an intelligent board this diagnostic offset 418 may point to self test program 252 within read only memory 250. In the case of a nonintelligent board, diagnostic offset 418 points to the beginning of self test memory 340 where the diagnostic program is stored.

Figure 5A:
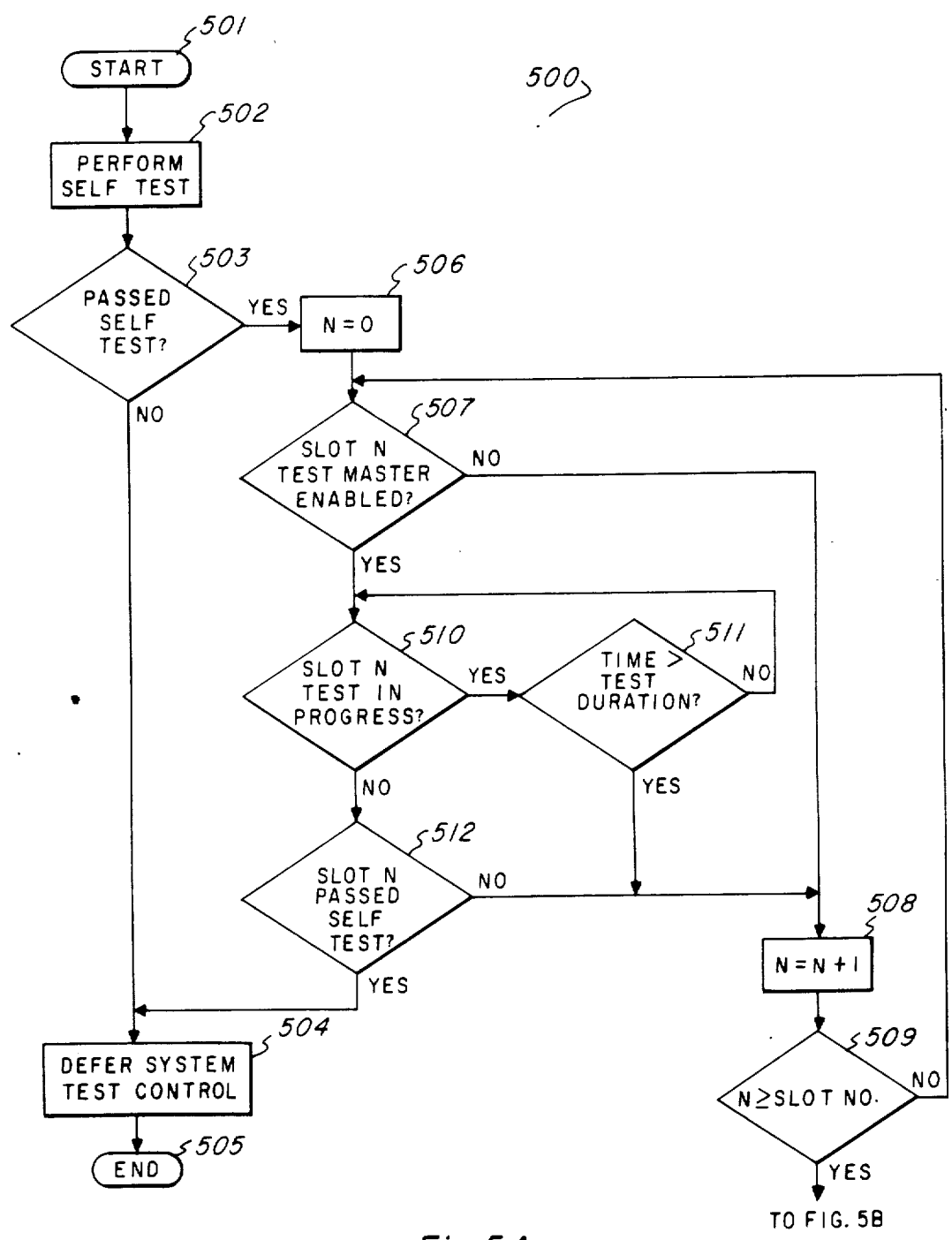
FIGS. 5a and 5b illustrate a flow chart of the program of each intelligent data processing circuit in accordance with the present invention.
Figure 5B:
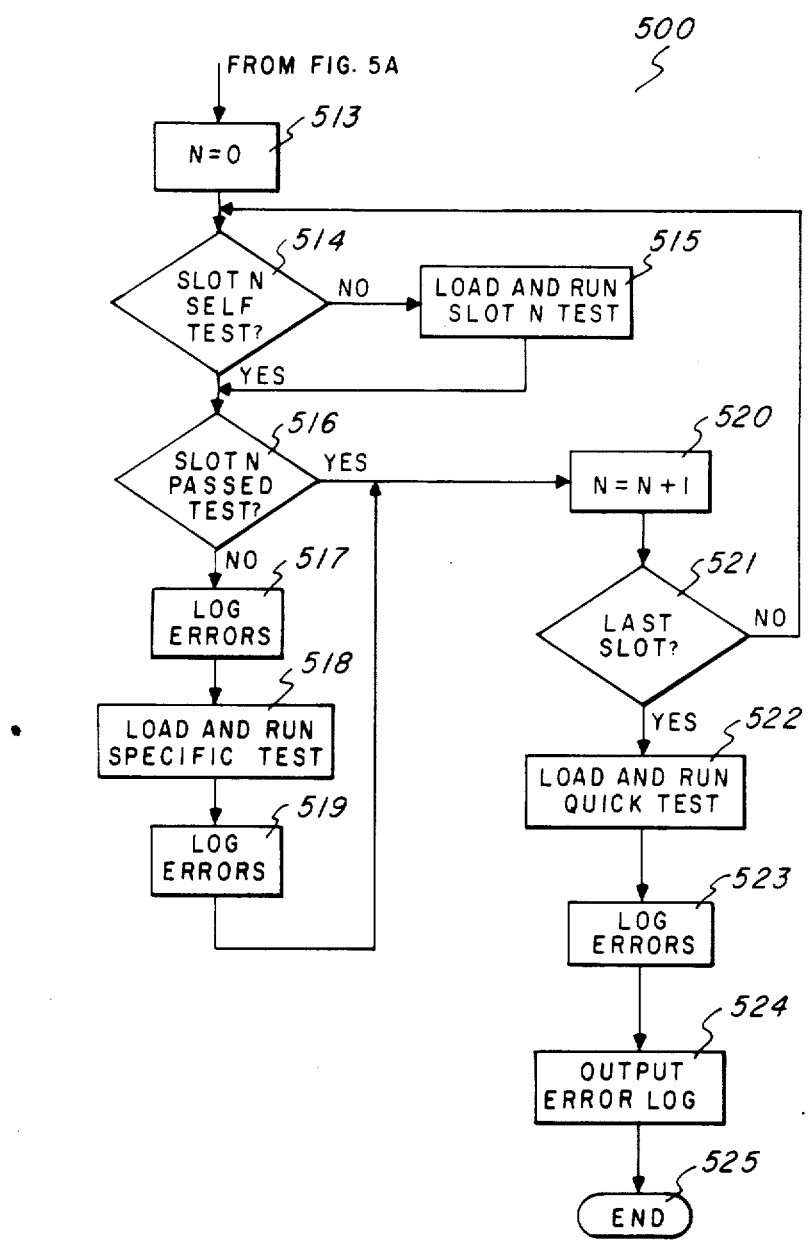

FIGS. 5A and 5B illustrate program 500 which is executed by each intelligent data processing circuit within data processing system 100. Program 500 is included in system test program 253 illustrated in FIG. 2. Program 500 includes the functions of circuit self test, system test master arbitration and system test control.

Program 500 is begun at start block 501. Program 500 first performs the circuit self test within the intelligent data processing circuit. This is performed by execution of the program stored in self test memory 252 illustrated in FIG. 2. This circuit self test may be written in the native language of data processing unit 220 on that intelligent data processing circuit board. In the alternative, this self test program may be written in the intermediate level interpretable test language and interpreted via the interpreter program 254. In either event, the major functions of the intelligent data processing circuit board are tested under program control of data processing unit 220. Processing block 502 includes setting self test in progress flag 432 to indicate that the circuit self test is in progress, executing self test program 252, resetting self test in progress flag 432 to indicate the self test is complete and setting or resetting self test pass/fail flag 431 as necessary to indicate the result.

Program 500 then tests to determine whether or not the intelligent data processing circuit board has passed its own circuit self test (decision block 503). In the event that the intelligent data processing circuit board has not passed its own self test, then this circuit board cannot be the system test master. In such an event program 500 defers system test control (processing block 504) and program 500 is terminated (end block 505).

If the circuit board has passed its own circuit test then it is a candidate for system test master. A loop variable N is then set to zero (processing block 506). Program 500 now tests slot N to determine whether or not it can be a system test master (decision block 507). This test is achieved by having the present circuit generate a read memory signal specifying the address of the system test master enable flag 414 of identity memory 410. As will be recalled, the start address of identity memory 410 is identical for each circuit board with the exception of the most significant bits being determined by the particular slot. Knowing the slot to be accessed thus permits the intelligent data processing circuit board to determine the address of system test master enable flag 414 and thereby read from this memory.

In the event that slot N is not enabled as a system test master, then the loop variable is incremented (processing block 508). Program 500 then tests to determine whether or not the loop variable is greater than or equal to the slot number of the current circuit (decision block 509). If the loop variable N is not greater than or equal to the slot number of the present circuit board, then flow returns to decision block 507 to determine whether the next slot is master enabled.

In the event that it is determined that a particular slot can be the system test master, then program 500 tests to determine whether or not the test program of this slot is in progress (decision block 510). This test is achieved by reading the self test in progress flag 432 from flag register 430. The location of flag register offset 413 is fixed once the slot number and the corresponding most significant bits of the address have been selected. Using the information in flag register offset 413, it is possible to calculate the address of self test in progress flag 432 thus the intelligent data processing circuit can generate a read memory signal to read the data in self test in progress flag 432. If this self test is in progress, then program 500 has to determine whether the total time elapsed since the beginning of program 500 exceeds the test duration indicated by test time date 417 (decision block 511). The test duration data may be recalled from test time memory 417 of identity memory 410. If this test time has not been exceeded, then program 500 returns to decision block 510 to again test whether or not the self test of that particular slot is in progress. Program 500 remains in this loop until either the test is completed or the time exceeds the test duration. In the event the time exceeds the test duration, then program 500 proceeds to processing block 508 to increment the loop variable. This is the same as assuming that the slot has failed its circuit test. This time out provision prevents the system from being locked up if an intelligent data processing circuit board fails in a manner which always indicates circuit self test in progress. If the circuit in this slot has circuit self test in progress longer than the predetermined test duration stored in its identity memory, then the other intelligent data processing circuits assume that the circuit in this slot has failed.

It should be noted that it is not necessary for program 500 to remain in the loop including decision blocks 510 and 511 while waiting for the circuit self test to complete or for time out. It would be equally possible for program 500 to go on to test other slot numbers, returning periodically to test that particular slot number. That particular slot would be tested to determine whether or not its circuit self test continues to be in progress and whether or not the time in which this circuit self test has been in progress exceeds the test duration for that circuit board. This alternative system has the advantage that the intelligent data processing circuit board is not tied up in a relatively useless loop during the time it is waiting either for the circuit self test to complete or for time out.

In the event that a system test master enabled circuit board has completed its circuit self test, program 500 then tests to determine whether or not the circuit board in this slot has passed its self test (decision block 512). This is achieved by reading self test pass/fail flag 431 from the flag register 430. In the event that this slot has passed its own circuit self test, then the current circuit board defers system test control (processing block 504) and stops program 500 (end block 505). This is in accordance with the arbitration procedure for determining the system test master. The intelligent data processing circuit board which has passed its circuit self test and which occupies the lowest slot number is the system test master. Thus, any intelligent data processing circuit board which determines that an intelligent data processing circuit in a lower slot number has met these conditions must defer taking system test control. In the event that this slot has not passed its circuit self test, then program 500 increments the loop variable (processing block 508) and the loop is repeated if necessary.

In the event that program 500 determines that the variable N is greater than or equal to the current slot number (decision block 509) then this circuit board is system test master. This is because the program has not detected any other intelligent data processing circuit which has passed its own circuit self test and which occupies a lower slot number.

Upon this determination, the loop variable is again set to zero (processing block 513). Program 500 then tests to determine whether slot N performs its own self test (decision block 514). In the event that this slot number does not perform its own self test, then program 500 loads and runs the self test for this slot number N (processing block 515). This is achieved by calculating the beginning address of the diagnostic program 400 from the diagnostic offset 418. The diagnostic program 440 is written in the test language. It is executed by recall from the nontesting circuit board, interpretation via interpreter program 254 and execution of these tests. This will require communication between the nonself testing circuit and the system test master circuit via communications bus 110. This diagnostic program must be written to exercise the major facilities of the nonself testing circuit. Program 500 then tests to determine whether the circuit in this slot has passed its circuit test (decision block 516), whether this has been its own circuit self test or a diagnostic program 440 executed by the system test master.

In the event that the circuit board in slot N has failed its circuit test, then program 500 logs the errors observed (processing block 517). Next a specific test program corresponding to those errors is loaded and run (processing block 518). This is most often a longer and more detailed test which may be stored in disk drive 165 and recalled via communication with disk controller 160. This specific test program is preferably also written in the test language. This is preferable because then each processor within the data processing system can execute this specific test program via its own interpreter program 254. This specific test program is designed to more fully utilize the capabilities of the circuit under test and to more particularly isolate the failing subsystem. These errors are then logged (processing block 519).

In the event that a slot has passed its circuit test or a specific test has been run and those errors logged, program 500 then increments the loop variable (processing block 520). Next program 500 tests to determine whether the last slot has been considered (decision block 521). If the last slot has not been considered then flow returns to decision block 514. Thus, program 500 continues in this loop until each slot has been considered. Note that it is not necessary to consider any special case for the slot of the system test master. This is because it will have been previously determined that the intelligent data processing circuit executing program 500 has passed its own circuit self test and therefore decision block 516 will continue the loop.

Once the last slot has been tested, then program 500 loads and runs a quick test of the system (processing block 522). This quick test will ordinarily requires each slot in turn to write some data to a known good memory location and then recall it for comparison. This quick test will enable the system test master to determine whether or not the communications bus is working adequately for all slots. Program 500 then logs any errors found in this quick test (processing block 523). Program 500 then outputs any errors appearing in the error log (processing block 524). These errors may have been previously logged in processing blocks 517 or 519 or may be errors determined during the quick test and logged in processing block 523. At this point program 500 is terminated via exit block 525.

What is claimed is:

1. A self testing data processing system comprising:
   a communications bus having a plurality of connection slots for bidirectional communication between said slots;
   at least one nonintelligent data processing circuit, each nonintelligent data processing circuit connected to one of said slots and having a test memory means connected to and readable from said communications bus, said test memory means having a diagnostic program, written in an intermediate level interpretable test language, stored therein for testing said nonintelligent data processing circuit; and
   at least one intelligent data processing circuit connected to said communications bus and having an interpreter program and a testing means, said interpreter program for interpreting said intermediate level interpretable test language, and said testing means, including data processing means for executing programs stored in memory, for testing said at least one nonintelligent data processing circuit via said communications bus by recall, interpretation and execution of said test program stored in said test memory means.

2. A self testing data processing system as claimed in claim 1, wherein:
   each intelligent data processing circuit includes a processor means for performing general purpose data processing tasks under program control in a native language.

3. A self testing data processing system as claimed in claim 2, wherein:
   said at least one intelligent data processing circuit includes a plurality of intelligent data processing circuits of at least two differing types, each of said differing types having differing native languages and differing test interpreter programs, whereby the testing of said at least one nonintelligent data processing circuit is independent of the native language of any one of said intelligent data processing circuits.

4. A self testing data processing system as claimed in claim 1, wherein:
said at least one nonintelligent data processing circuit includes a plurality of nonintelligent data processing circuits of at least two differing types, each of said differing types of nonintelligent data processing circuits having differing diagnostic programs stored in their test memory means.

5. A self testing data processing system as claimed in claim 1, further comprising:
at least one mass memory means connected to said communication bus having a system test program, written in said intermediate level interpretable test language, stored therein for testing said data processing system, whereby said at least one intelligent data processing circuit can test said data processing system via said communications bus by recall, interpretation and execution of said system test program stored in said mass memory means.

6. A self testing data processor system as claimed in claim 5, wherein:
said at least one mass memory means includes a plurality of system test programs, each system test program for testing a differing aspect of said data processing system in detail.

7. A self testing data processing system as claimed in claim 1, wherein:
said testing means of each intelligent data processing circuit is actuated upon initial application of electric power.

8. A self testing data processing system as claimed in claim 1 wherein:
said testing means of each intelligent data processing circuit is actuated via a system reset command on said communications bus.

9. An intelligent data processing circuit for connection to and bidirectional communciation with a communications bus, having a processor means for performing general purpose data processing tasks under program control in a native language, an interpreter means, coupled to said processor means for interpreting an intermediate level interpretable test language independent of said native language, and a testing means coupled to said processor means for testing another circuit connected to said communications bus by recall, via said communications bus, from said another circuit, interpretation and execution of a test program written in said intermediate level interpretable diagnostic language.

10. An intelligent data processing circuit as claimed in claim 9, wherein:
said testing means is actuated upon initial application of electric power to said intelligent data processing circuit.

11. An intelligent data processing circuit as claimed in claim 9, wherein:
said testing means is actuated via a system reset command on said communications bus.

12. An intelligent data processing circuit as claimed in claim 9, further comprising:
a test memory for storing a diagnostic program therein, said diagnostic program for testing said intelligent data processing cirucit being written in said processor independent intermediate level interpretable test language; and
said test memory further including means for testing said intelligent data processing circuit by recall, interpretation and execution of said diagnostic program stored in said test memory.

* * * * *